United States Patent
Remke et al.

(10) Patent No.: US 7,358,212 B2
(45) Date of Patent: Apr. 15, 2008

(54) METHOD FOR PRODUCING MULTINARY METAL OXIDE POWDERS IN A PULSED REACTOR

(75) Inventors: Stefan Remke, Darmstadt (DE); Bernd Mueller, Zwingenberg (DE); Guenter Riedel, Darmstadt (DE); Stefan Ambrosius, Berlstedt (DE); Bernd Dahm, Weimar (DE)

(73) Assignee: Merck Patent GmbH, Darmstadt (DE)

( * ) Notice: Subject to any disclaimer, the term of this patent is extended or adjusted under 35 U.S.C. 154(b) by 514 days.

(21) Appl. No.: 10/471,590

(22) PCT Filed: Mar. 6, 2002

(86) PCT No.: PCT/EP02/02408

§ 371 (c)(1),
(2), (4) Date: Sep. 12, 2003

(87) PCT Pub. No.: WO02/072471

PCT Pub. Date: Sep. 19, 2002

(65) Prior Publication Data

US 2004/0077481 A1 Apr. 22, 2004

(30) Foreign Application Priority Data

Mar. 13, 2001 (DE) .................. 101 11 938

(51) Int. Cl.
*B01J 23/02* (2006.01)
*B01J 23/06* (2006.01)
*B01J 23/70* (2006.01)
*B01J 23/72* (2006.01)
*B01J 23/00* (2006.01)

(52) U.S. Cl. ............ 502/340; 502/341; 502/342; 502/343; 502/346; 502/347; 502/348; 502/354; 502/355; 502/302; 502/303; 502/304; 502/349

(58) Field of Classification Search ............... 423/604, 423/608, 617–619, 622; 502/302–304, 324, 502/341–343, 346–349, 352, 354, 355, 340
See application file for complete search history.

(56) References Cited

U.S. PATENT DOCUMENTS 4,997,808 A * 3/1991 Chatterjee et al. .......... 505/233
5,075,284 A * 12/1991 Yamazaki ................... 505/233

(Continued)

FOREIGN PATENT DOCUMENTS

DE 1960841 C 8/1997

(Continued)

OTHER PUBLICATIONS

Shelukar S.D. et al "Continuous Rotary Kiln Calcination of YBaCuO Precursor Powders" Ind. Eng. Chem. Res., Bd. 33, 1994, Seiten 421-427.

*Primary Examiner*—Cam N. Nguyen
(74) *Attorney, Agent, or Firm*—Millen, White, Zelano, Branigan, P.C.

(57) ABSTRACT

The invention relates to a method for producing a one-part, multinary metal oxide power which is suitable for producing high-temperature superconductors. To this end, a mixture of the corresponding metal salts and/or metal oxides and/or metals in the requisite stoichiometric ratio is introduced into a pulsed reactor with a pulsed gas flow resulting from flameless combustion and is partially or completely converted into the multinary metal oxide.

16 Claims, 1 Drawing Sheet

U.S. PATENT DOCUMENTS

| | | | | |
|---|---|---|---|---|
| 5,100,863 A | * | 3/1992 | Yamazaki | 505/471 |
| 5,106,830 A | * | 4/1992 | Sheng et al. | 505/120 |
| 5,114,702 A | * | 5/1992 | Pederson et al. | 423/639 |
| 5,204,313 A | * | 4/1993 | Lelental et al. | 505/446 |
| 5,340,796 A | * | 8/1994 | Cava et al. | 505/121 |
| 5,372,990 A | * | 12/1994 | Nobumasa et al. | 505/125 |
| 5,462,917 A | * | 10/1995 | Salama et al. | 505/150 |
| 5,492,886 A | * | 2/1996 | Morris | 505/482 |
| 5,565,414 A | * | 10/1996 | Akimitsu et al. | 505/121 |
| H1683 H | * | 10/1997 | Yamazaki | 252/500 |
| 5,705,457 A | * | 1/1998 | Tamura et al. | 505/482 |
| 5,814,585 A | * | 9/1998 | Riddle et al. | 505/121 |
| 5,919,735 A | * | 7/1999 | Ihara et al. | 505/125 |
| 6,027,826 A | * | 2/2000 | deRochemont et al. | 428/702 |
| 6,540,838 B2 | * | 4/2003 | Sneh et al. | 118/715 |
| 6,630,401 B2 | * | 10/2003 | Sneh | 438/680 |
| 6,677,278 B1 | * | 1/2004 | Woodall et al. | 505/121 |
| 6,723,642 B1 | * | 4/2004 | Lim et al. | 438/680 |
| 6,794,339 B2 | * | 9/2004 | Wiesmann et al. | 505/470 |

FOREIGN PATENT DOCUMENTS

| | | |
|---|---|---|
| DE | 19614430 C | 10/1997 |
| EP | 0905104 A | 3/1999 |
| WO | WO 9938819 A | 8/1999 |

* cited by examiner

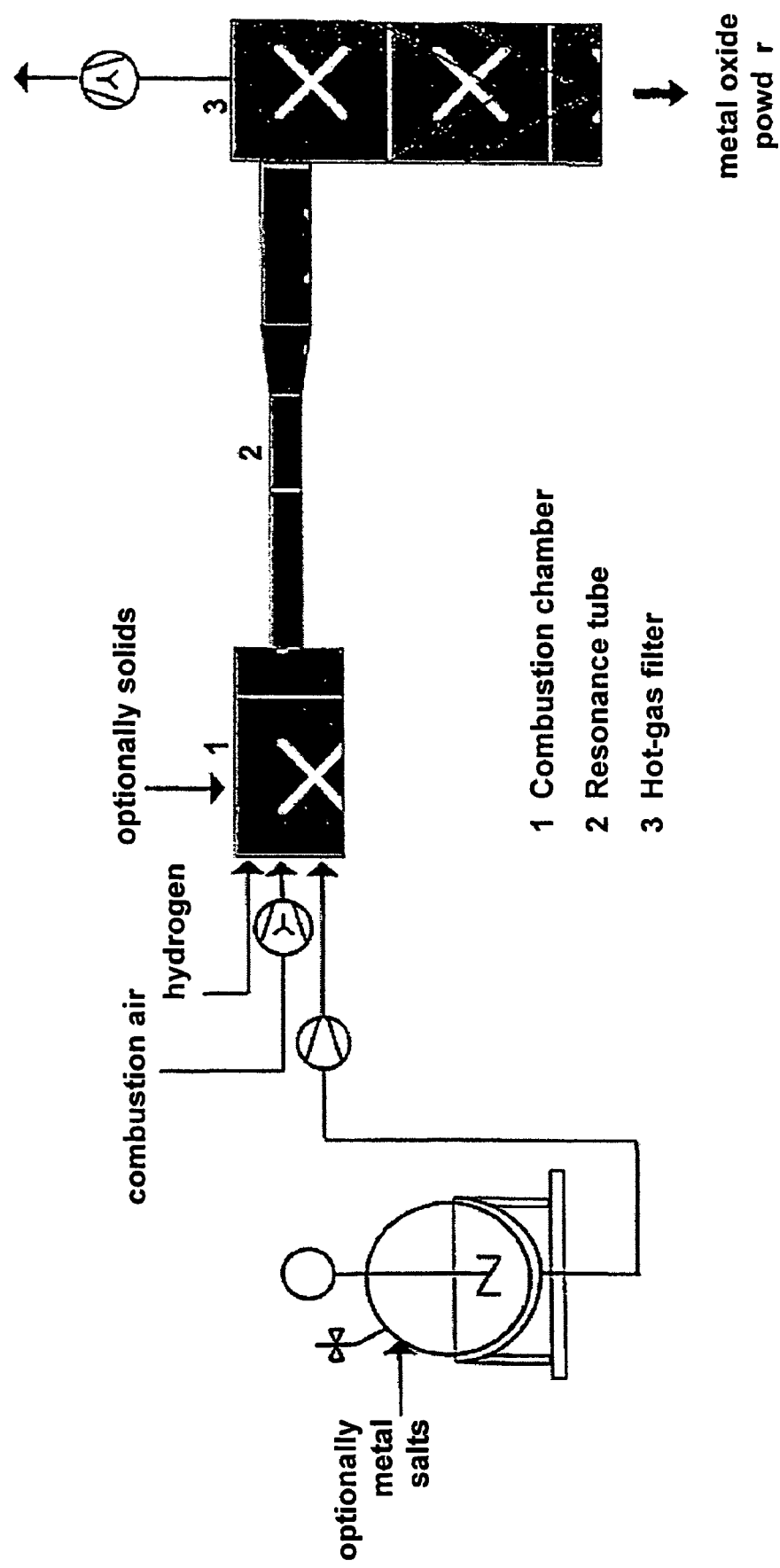

METHOD FOR PRODUCING MULTINARY METAL OXIDE POWDERS IN A PULSED REACTOR

The present invention relates to a method for producing a finely divided, multinary metal oxide powder, i.e. one which comprises a plurality of elements, which is suitable for use as precursor of high-temperature superconductors.

High-temperature superconductor materials (HTSCs) are multinary oxides having high requirements of chemical purity, homogeneity, defined phase composition and crystallite size as well as reproducibility. The prior art discloses some methods for producing the corresponding multiphase metal oxide powders from which high-temperature superconductors can be produced by further processing, for example bulk material by pressing, extrusion and/or sintering, or wire and band conductors by means of "powder-in-tube methods".

EP 117 059, EP 522 575, EP 285 392, EP 302 830, EP 912 450 and U.S. Pat. No. 5,298,654 describe the co-precipitation of metal compounds, for example nitrates or chlorides, dissolved in water. The water-insoluble or sparingly soluble metal oxalate mixtures are precipitated here from the solutions with oxalic acid. Industrial implementation of these processes requires high technical complexity both in the co-precipitation and in the disposal or reuse of the resultant degradation products. Spray-drying of co-precipitation products of this type, which are usually only present as solid in low concentration in the "mother liquor" (order of magnitude of 10%), is unfavourable from an energy point of view. In addition, volatile products can be formed by reverse reactions in the thermal dewatering which are discharged with the exhaust air and which thus influence the chemical composition of the subsequent products in a non-reproducible manner.

In other methods, mixtures of aqueous salt solutions of the elements which are to be present in the superconductor are subjected to spray pyrolysis.

WO 89/02871 describes a method for producing multi-element metal oxide powders for use as precursors for HTSC ceramics, in which metal mixed-salt solutions are sprayed into a tubular furnace heated to a temperature of 800-1100° C. In this method, on the one hand the external electric heating of the tubular furnace means that only a low energy yield is achieved and on the other hand only a relatively low conversion to the mixed oxide is achieved.

EP 371 211 claims a spray pyrolysis method for producing finely divided, homogeneous ceramic powders in which a solution or suspension of compounds which comprise the elements of the powder to be produced is sprayed with the aid of a combustible gas, preferably hydrogen gas, into a reactor in which the gas is burned. Conversion of the sprayed droplets into the oxide powders takes place in the flame at a measurable temperature of 1200-1300° C. In the case of the use of nitrate solutions, it must be assumed that much higher temperatures act on the droplet/particle system. The production of powders for high-temperature superconductors having a defined composition is difficult with this method since the powders generally also comprise volatile metal oxides, for example Bi or Pb oxides, which volatilise in variable proportions.

DE 195 05 133 describes a method for producing highly disperse oxidic powders in which an aerosol of dissolved or liquid compounds in oxygen is fed to a cracking gas reactor under pressure before combustion. Very high reaction temperatures are likewise required here.

EP 681 989 describes a method in which aerosols of aqueous solutions comprising a mixture of the corresponding metal salts in the requisite stoichiometric ratio are pyrolysed in a hydrogen/oxygen flame. The flame temperature here is kept in the range from 800 to 1100° C. Contact of the aerosols and the powders produced in the method with carbon or carbon-containing compounds or materials must be avoided here.

In summary, it must be noted that the known spray pyrolysis methods for producing high-temperature superconductor powders have the following disadvantages: undesired high-temperature phases form. The evaporation of volatile oxides can result in stoichiometry variations or in inadequate reproducibility of the chemical composition. The methods result in inadequate conversion to the mixed oxide or in a high residual nitrate content. Coarse and hard agglomerates form and pulverulent deposits form on the reactor wall and have to be removed regularly, which may cause operation of the plants to be interrupted, and are often the source of hard agglomerates. Furthermore, the limited reactor geometry means that there is only an inadequate possibility of scale-up.

DD 245 674 and DD 245 649 describe methods for producing silicate substances or single-phase oxides in which liquid silica sols or liquid or dissolved metal compounds with organic ligands are atomised and thermally treated in pulsed combustion in a pulsed furnace reactor. This method produces highly disperse silica gels or oxides with specific particle sizes, surface areas and surface structures.

The object of the present invention is to provide a technically and economically advantageous method for producing a multinary, at least ternary metal oxide powder which is suitable for use as precursor of high-temperature superconductors and which does not have the disadvantages of the prior art.

This object is achieved in accordance with the invention by a method in which a mixture of the corresponding metal salts and/or metal oxides and/or metals in solid form or in the form of a solution or suspension in the requisite stoichiometric ratio comprising at least three elements selected from Cu, Bi, Pb, Y, Tl, Hg, La, lanthanides and alkaline earth metals is introduced into a pulsed reactor with a pulsed gas flow resulting from flameless combustion and is partially or completely converted into the multinary metal oxide.

The method according to the invention is distinguished by the fact that a mixture of the corresponding metal salts, metal oxides or metals is introduced into a pulsed reactor and is converted into the multinary metal oxide, i.e. one comprising a plurality of elements. The metals or metal compounds here are employed in the requisite stoichiometric ratio and comprise at least three elements, preferably three, four or five elements, selected from the group consisting of Cu, Bi, Pb, Y, Tl, Hg, La, lanthanides and alkaline earth metals. The resultant finely divided metal oxide powder comprising a plurality of elements is suitable for use in the production of high-temperature superconductor ceramics.

Surprisingly, in spite of extremely short residence times in the reactor, the method according to the invention gives multinary oxides having a high degree of conversion. The method exhibits high reactivity for target-phase formation and good reproducibility of the composition. The particles produced in accordance with the invention have small particle sizes, and no coarse or hard agglomerates are formed during the production.

The principle on which the pulsed reactor works is the same as that of an acoustic cavity resonator, which consists of a combustion chamber, a resonance tube and a cyclone or filter for powder separation. A pulsed reactor according to the invention is depicted in FIG. 1. It consists of a combustion chamber (1), to which a resonance tube (2) having a significantly reduced flow cross section compared with the combustion chamber is connected on the exhaust-gas side. The combustion chamber base is fitted with one or more valves for the entry of the combustion gases. The powders are separated from the gas flow using a suitable filter (3) for ultra-fine particles.

The combustion-gas mixture entering the combustion chamber is ignited, burns very quickly and produces a pressure wave in the direction of the resonance tube since the gas entry side is substantially sealed in the case of an excess pressure by aerodynamic valves. The gas flowing out into the resonance tube produces a vacuum in the combustion chamber, meaning that fresh gas mixture flows in through the valves and ignites itself. This process of valve closing and opening due to pressure and vacuum takes place periodically with self regulation. The pulsed flameless combustion process in the combustion chamber liberates energy with the propagation of a pressure wave in the resonance tube and initiates an acoustic vibration there. Pulsed flows of this type are characterised by a high degree of turbulence. The pulsation frequency can be set via the reactor geometry and varied in a targeted manner via the temperature. This causes the person skilled in the art no difficulties at all. The gas flow resulting from flameless combustion preferably pulses at from 20 to 150 Hz, particularly preferably at from 30 to 70 Hz.

With respect to the combustion-chamber pressure and the gas velocity in the resonance tube, non-steady-state conditions exist, ensuring particularly intense heat transfer, i.e. very fast and extensive energy transfer from the pulsed hot gas flow to the solid particles. Very considerable reaction progress is thus achieved in accordance with the invention at very short residence times in the millisecond range. Surprisingly, a high degree of the defined mixed oxide formation can be achieved under these conditions, even in the case of multinary substance systems. Advantageously, scale-up of the method according to the invention is possible.

A suitable fuel gas is in principle any gas which is suitable for the production of hot gas. If desired, this is employed in the form of a mixture with oxygen. Natural gas and/or hydrogen mixed with air or, if desired, oxygen is preferably used. However, propane or butane, for example, are also conceivable. In contrast to pyrolysis methods, for example in a permeation reactor, the combustion air thus also serves as carrier gas for material transport in the reactor.

The mixture of the corresponding metals and/or metal compounds can be introduced into the reactor either in solid form, in particular in the form of a powder, or in the form of a solution or suspension. Solid substance mixtures to be calcined can be conveyed into the gas flow by means of an injector, with the pulsed turbulent flow resulting in fine distribution of the material in the reaction space. Solutions or suspensions are introduced in extremely finely divided form by means of one or more nozzles, preferably by means of a two-component nozzle. Very rapid water removal or thermal decomposition of the reactants thus occurs, and the solid particles which remain can react in the hot gas flow to form the mixed oxide.

In a preferred embodiment of the method according to the invention, the mixture is introduced in the form of an aqueous salt solution or suspension of nitrates, acetates, citrates, lactates, tartrates, chlorides, hydroxides, carbonates and/or oxalates of the corresponding metals. Particular preference is given to the use of salt solutions of the corresponding metals with the same counteranion.

In accordance with the invention, the mixture is introduced into the hot gas flow of the pulsed reactor resulting from flameless combustion. This causes any solvent present to evaporate or burn, and metal-salt or metal-oxide particles form and are then converted completely or partially into the multinary metal oxide during the further course of the reaction through thermal conversion, oxidation and/or reduction.

In the method according to the invention, the mixture can be introduced either directly into the combustion chamber of the pulsed reactor or into the pulsed reactor resonance tube connected to the combustion chamber. Introduction into the resonance tube has the advantage that the combustion process is separated from the chemical solid-state reactions.

The flameless combustion and the turbulent flow conditions mean that a homogeneous temperature distribution exists in the reaction space, meaning that the raw materials introduced are subject to identical thermal treatment. Local overheating and wall deposits, which result in the formation of coarse and hard agglomerates in the spray pyrolysis methods, are thus avoided. The gas flow resulting from the pulsed combustion in the pulsed reactor has flow turbulences whose degree of turbulence is, in a preferred embodiment, from 5 to 10 times greater than the degree of turbulence of steady-state flow. The temperature of the gas flow in the combustion chamber of the pulsed reactor is preferably above 650° C., in particular above 800° C. If the combustion chamber and, if desired, the resonance tube have ceramic linings, it is also possible to carry out the method according to the invention at very high gas-flow temperatures, which cannot be achieved using other methods.

The particles produced in the reactor are separated from the gas flow in a suitable separator, the choice of which presents the person skilled in the art with no difficulties at all, such as, for example, a gas cyclone, a surface filter or an electrostatic filter.

The reaction gas is cooled to the temperature necessary depending on the filter type before entering the separator. This is carried out by means of a heat exchanger and/or by introducing cooling gases into the exhaust-gas flow. The particular advantage of the method according to the invention is that inexpensive high-performance suspended-matter filters with comparatively large specific filter surface areas and throughput efficiencies can be used instead of hot-gas filters. The introduction of $CO_2$-free cooling gases enables the production of powders having a particularly low residual carbon content. By varying the oxygen partial pressure during introduction of the cooling gases, the phase composition of the powder can be influenced.

In a variant of the method according to the invention, the mixture of the corresponding metals or metal compounds employed may additionally comprise dopants in the form of dissolved salts and/or dispersed solids. These dopants are added to the mixture in small amounts, i.e. up to a maximum of 5% by weight, preferably up to 1% by weight of the mixture, in order specifically to influence certain properties of the multinary metal oxide powder to be produced. For example, dopants enable the crystallite size of secondary phases, which act as pinning centres, to be limited or the mechanical properties of the bulk material to be improved. The term crystallite size is taken to mean the size of the crystallographically uniform region of a powder particle, and a pinning centre is a centre of adhesion for the magnetic flux in superconductors (for example on non-superconducting secondary phases). The dopant used is one or more of the elements selected from group Ib, for example Ag, from group IIb, for example Zn, from group IVa, for example Sn, from group IVb, for example Zr, and/or from group VIIb of the Periodic Table, for example Mn.

In a further variant of the method according to the invention, the metal oxide powder can be subjected to thermal aftertreatment at a temperature in the range from 500 to 960° C., preferably from 550 to 800° C., after the reaction in the pulsed reactor. The choice of a suitable type of post-calcination depending on the powder type, desired phase composition and application presents the person skilled in the art with no difficulties at all. Particular preference is given to post-calcination in a powder bed in a chamber, tubular, tunnel, belt or rotary tube furnace or in a fluidised bed. The conditions here should be set in such a way that firstly the desired phase composition is reached, but secondly no formation of hard agglomerates due to sintering or melting of primary crystallites occurs. If necessary, the powder is subjected to grinding by means of an air-jet mill, grinding-media mill, impact mill or other milling machines.

Preference is given to methods according to the invention in which the corresponding metals or metal compounds are selected from one of the following compositions: Bi-EA-Cu, (Bi,Pb)-EA-Cu, Y-EA-Cu, (Y,SE)-EA-Cu, Tl-EA-Cu, (Tl,Pb)-EA-Cu or Tl(Y,EA)-Cu, where EA denotes alkaline earth metal elements, in particular Ba, Ca and/or Sr, and SE denotes rare-earth metals.

Particular preference is given to the use in the method according to the invention of mixtures in which the substances employed have the following molar ratios of the corresponding metals:

$Bi_{(2.0+/-x)}Sr_{(2.0+/-x)}Ca_{(1.0+/-x)}Cu_{(2.0+/-x)}$ where x=0.3, preferably where x=0.2, or $Pb_{(0.3+/-y)}Bi_{(1.7+/-y)}Sr_{(2.0+/-y)}Ca_{(2.0+/-y)}Cu_{(3.0+/-y)}$ where y=0.3
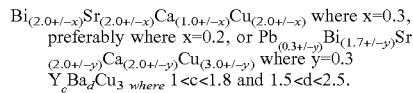 where 1<c<1.8 and 1.5<d<2.5.

The present invention furthermore relates to a finely divided, multinary metal oxide powder which has been produced by a method according to the invention. In a particularly preferred embodiment, the mean crystallite size of the metal oxide powder produced in accordance with the invention, i.e. the mean size of the crystallographically uniform region of a powder particle, is <500 nm. Preference is given to the production in accordance with the invention of metal oxide powders which consist of one of the following compositions: Bi-EA-Cu—O, (Bi,Pb)-EA-Cu—O, Y-EA-Cu—O, (Y,SE)EA-Cu—O, Tl-EA-Cu—O, (Tl,Pb)-EA-Cu—O or Tl—(Y,EA)-Cu—O, where EA denotes alkaline earth metal elements, in particular Ba, Ca and/or Sr, and SE denotes rare-earth metals.

The present invention likewise relates to the use of the metal oxide powders produced in accordance with the invention for the production of high-temperature superconductors.

The metal oxide powders produced in accordance with the invention can be used, for example, for the production of high-temperature-superconducting hollow or solid articles in the form of sheets, discs, rings, tubes, rods, etc., which can be used as power supply or bearing components. Powders or pressed rods can be used for the production of silver-clad high-temperature-superconducting wires or strip conductors. The wires and strip conductors are used, for example, for power cables, power lines, transformers, motor and generator coils, magnets, power supplies or bearings. Furthermore, the metal mixed oxide powders produced in accordance with the invention can be used for the production of targets for coating methods or can be used for the production of coated strip conductors.

The complete disclosure content of all applications, patents and publications mentioned above and below and of the corresponding application DE 101 11 938.0, filed on 13 Mar. 2001, are incorporated into this application by way of reference.

Even without further details, it is assumed that a person skilled in the art will be able to utilise the above description in its broadest scope. The preferred embodiments and examples of the method according to the invention should therefore merely be regarded as descriptive disclosure which is absolutely not limiting in any way.

EXAMPLE 1

A mixture of aqueous nitrate solutions of the elements Bi, Pb, Sr, Ca and Cu in accordance with the stoichiometry $Bi_{1.75}Pb_{0.35}Sr_{1.98}Ca_{2.0}CU_3O_x$ is produced, with the total salt content of the mixed nitrate solution being 40%.

The geometry of the pulsed reactor is defined by the combustion chamber length to combustion chamber diameter ratio of 2.2 and by the resonance tube length to resonance tube diameter ratio of 33. The mixed nitrate solution is introduced into the front section of the resonance tube in the form of an aerosol by means of a two-component nozzle. The process parameters of amount of fuel (hydrogen) $V_{H2}$ and amount of combustion air $V_{VL}$ are selected in accordance with the mixed nitrate solution sprayed in M in such a way that the desired reaction temperature of 700° C. becomes established in the resonance tube: $V_{H2}$=2.5 kg/h; $V_{VL}$=195 kg/h; M=10 kg/h. The combustion gases at the end of the resonance tube comprise 16.9% of $O_2$, 0.09% of $CO_2$ and 0.24% of NO.

Powder separation is carried out by means of cassette filters having a filter area of 24 m² and a maximum surface temperature of 130° C.

Properties of the $Bi_{1.75}Pb_{0.35}Sr_{1.98}Ca_{2.0}CU_3O_x$ powder produced:
mean particle size 0.15 μm
specific surface area 9.4 m²/g
residual nitrate content: 6.0%

Post-calcination is carried out for 8 hours in a chamber furnace at a temperature of 810° C., with the multinary metal oxide powder being introduced into Ag boats with a maximum bed depth of 4 cm. The nitrate content of the samples is reduced to values <100 ppm, and the desired phase composition of the multinary metal oxide powder produced is set.

EXAMPLE 2

A substance mixture as described in Example 1 is sprayed axially into the combustion chamber of the pulsed reactor. With $V_{H2}$=3.1 kg/h; $V_{VL}$=195 kg/h; M=10 kg/h, a reactor temperature of 900° C. is set. The combustion gases comprise 14.6% of $O_2$, 0.08% of $CO_2$ and 0.28% of NO. All other parameters correspond to those of Example 1.

Properties of the $Bi_{1.75}Pb_{0.35}Sr_{1.98}Ca_{2.0}CU_3O_x$ powder produced:
mean particle size 0.24 μm
specific surface area 8.4 m²/g
residual nitrate content: 4.4%

Post-calcination for 8 hours in a chamber furnace at a temperature of 800° C., with the multinary metal oxide powder being introduced into Ag boats with a maximum bed depth of 4 cm, reduces the nitrate content of the samples to values <100 ppm, and the desired phase composition of the multinary metal oxide powder produced is set.

EXAMPLE 3

A mixture of chlorides of the elements Y, Ba and Cu corresponding to the stoichiometric ratio $Y_{1.5}Ba_2CU_3$ is sprayed into the combustion chamber of the reactor as described in Example 1. With $V_{H2}$=1.0 kg/h; $V_{VL}$=75 kg/h; M=3.0 kg/h, a reactor temperature of 900° C. is set.

Powder properties:
mean particle size 70 nm
specific surface area 12 m²/g
residual chloride content: 2.5%

The post-calcination is carried out for 4 hours at 710° C. in a chamber furnace. This causes the residual chloride content to be reduced to <50 ppm without reducing the sinter reactivity of the powder.

The invention claimed is:

1. A method for producing a finely divided, multinary metal oxide powder, said method comprising introducing a mixture comprising corresponding metal salts, metal oxides, and/or metals in the form of a solid, solution, or suspension in the requisite stoichiometric ratio of at least three elements which are Cu, Bi, Pb, Y, Tl, Hg, La, lanthanides, or alkaline earth metals directly into a combustion chamber of a pulsed reactor or into a pulsed reactor resonance tube that is connected to the combustion chamber, with sufficient turbulence to result in a homogeneous distribution of temperature and mixture so as to produce the multinary metal oxide in one single step.

2. A method according to claim 1, wherein the mixture introduced is an aqueous salt solution or suspension of nitrates, acetates, citrates, lactates, tartrates, chlorides, hydroxides, carbonates and/or oxalates.

3. A method according to claim 1, wherein the gas flow in the pulsed reactor results from flameless combustion pulses of 20 to 150 Hz.

4. A method according to claim 1, wherein the gas flow in a pulsed reactor resulting from flameless combustion has flow turbulences whose degree of turbulence is 5-10 times greater than that of steady-state flow.

5. A method according to claim 1, wherein the gas flow in the combustion chamber of a pulsed reactor has temperatures above 650° C.

6. A method according to claim 1, wherein the mixture comprises dopants in the form of dissolved salts and/or dispersed solids of at least one of the element of group Ib group IIb, group IVa, group IVb or group VIIb of the Periodic Table.

7. A method according to claim 1, wherein the metal oxide powder is subjected to thermal aftertreatment at a temperature in the range from 500 to 960° C., after the reaction in a pulsed reactor.

8. A method according to claim 7, wherein the thermal aftertreatment is carried out in a chamber, tube, tunnel, belt, rotary tube furnace or in a fluidised bed reactor.

9. A method according to claim 1, wherein the mixture employed comprises Bi-EA-Cu, (Bi,Pb)-EA-Cu, Y-EA-Cu, (Y,SE)-EA-Cu, Tl-EA-Cu, (Tl,Pb)-EA-Cu or Tl-(Y,EA)-Cu, where LA denotes alkaline earth metal elements, and SE denotes rare-earth metals.

10. A method according to claim 9, wherein the compounds of the mixture are employed in the following molar ratio of the elements $Bi_{(2.0+/-x)} Sr_{(2.0+/-x)} Ca_{(1.0+/-x)} Cu_{(2.0+/-x)}$ where x=0.3, $Pb_{(0.3+/-y)} Bi_{(1.7+/-y)} Sr_{(2.0+/-y)} Ca_{(2.0+/-y)} Cu_{(3.0+/-y)}$ where y=0.3 or $Y_cBa_dCu_3$ where 1<c<1.8 and 1.5<d<2.5.

11. A method according to claim 9, wherein LA is Ba, Ca or Sr.

12. A method according to claim 1, wherein the finely divided metal oxide powder produced has a mean crystallite size of <500 nm.

13. A method according to claim 1, wherein the geometry of the pulsed reactor is defined by a combustion chamber length to combustion chamber diameter ratio of 2.2 and by a resonance tube length to resonance tube diameter ratio of 33.

14. A method according to claim 1, wherein the gas flow in the pulsed reactor results from flameless combustion pulses of 30 and 70 Hz.

15. A method according to claim 1, wherein the mixture comprises dopants in the form of dissolved salts and/or dispersed solids of at least one of Ag, Zn, Sn, Zr, or Mn.

16. A method for the production of high-temperature superconductors, comprising introducing a mixture comprising metal salts, metal oxides, and/or metals in the form of a solid, solution, or suspension in the requisite stoichiometric ratio of at least three elements which are Cu, Bi, Pb, Y, Tl, Hg, La, lanthanides, or alkaline earth metals into a pulsed reactor with sufficient turbulence to result in a homogeneous distribution of temperature and mixture so as to produce multinary metal oxide in one single step and pressing, extruding and/or sintering, so as to form said superconductor.

* * * * *

UNITED STATES PATENT AND TRADEMARK OFFICE
CERTIFICATE OF CORRECTION

PATENT NO. : 7,358,212 B2 Page 1 of 1
APPLICATION NO. : 10/471590
DATED : April 15, 2008
INVENTOR(S) : Stefan Ambrosius It is certified that error appears in the above-identified patent and that said Letters Patent is hereby corrected as shown below:

Column 8, line 7, reads "fluidised" should read --fluidized--
Column 8, line 11, reads "LA" should read --EA--
Column 8, line 22, reads "LA" should read --EA--

Signed and Sealed this

Sixth Day of April, 2010

David J. Kappos
*Director of the United States Patent and Trademark Office*